United States Patent [19]

Vento

[11] Patent Number: 4,782,288

[45] Date of Patent: Nov. 1, 1988

[54] METHOD FOR EVALUATING PROCESSING PARAMETERS IN THE MANUFACTURE OF SEMICONDUCTOR DEVICES

[75] Inventor: Giuseppe Vento, Agrate Brianza, Italy

[73] Assignee: SGS Microelettronica S.p.A., Catania, Italy

[21] Appl. No.: 946,239

[22] Filed: Dec. 24, 1986

[30] Foreign Application Priority Data

Dec. 31, 1985 [IT] Italy ................. 23417 A/85

[51] Int. Cl.[4] ............... G01R 17/00; G01R 31/00
[52] U.S. Cl. ..................... 324/158 R; 324/DIG. 1
[58] Field of Search ............... 430/22, 30; 437/8; 324/158 R, 65 R, DIG. 1; 250/306, 307, 491.1, 492.2; 156/626, 627

[56] References Cited

U.S. PATENT DOCUMENTS

| | | | |
|---|---|---|---|
| 4,347,479 | 8/1982 | Cullett | 430/30 |
| 4,399,205 | 8/1983 | Bergendahl | 430/30 |
| 4,475,811 | 10/1984 | Brunner | 324/158 R |
| 4,516,071 | 5/1985 | Buehler | 324/158 R |
| 4,538,105 | 8/1985 | Ausschnitt | 324/65 R |
| 4,640,888 | 2/1987 | Itoh et al. | 430/22 |
| 4,642,672 | 2/1987 | Kitakata | 430/22 |

FOREIGN PATENT DOCUMENTS

0089220  6/1982  Japan .................... 430/22

OTHER PUBLICATIONS

"Alignment and Mask Errors in IC Processing", by Nicholas et al., J. Electrochem. Soc. Sol. St. Sci. & Tech., 3/81, pp. 609–614.
"Electrically Measuring Misalignment Between Masking Levels on an Integrated Circuit Chip", by Dennison et al., IBM Tech. Discl. Bull., vol. 18, #11, 4/76, pp. 3645–3648.
"Application of Wafer Probe Techniques to the Evaluation of Projection Printers", by Ausschnitt et al., SPIE vol. 334, Optic. Microlig.–Technol. for the Mid-1980's, 12/82, pp. 17–25.
"Automatic Testing and Analysis of Misregistrations Found in Semiconductor Processing", by Stemp et al., IEEE Trans. on Electron. Dev., vol. ED-26, #4, 4/79, pp. 729–732.

Primary Examiner—Reinhard J. Eisenzopf
Assistant Examiner—W. Burns
Attorney, Agent, or Firm—Guido Modiano; Albert Josif

[57] ABSTRACT

This method, allowing pointing out of the effects of one manufacture parameter independently from other parameters and phenomena and yielding very high precision in measurement, comprises a first step in which a symmetrical resistive bridge is formed, comprising a pair of test resistive arms having topological characteristics related to the process or phenomenon to be evaluated and a pair of reference resistive arms. Each pair of arms is formed by two reciprocally counterposed resistors with identical topography and value. The method furthermore comprises a second step in which a current, having a known value, is applied to the bridge, the voltages present in suitable points of the bridge are measured, and the difference in conductance between the pair of test resistive arms and the reference arms is calculated according to the known or calculated current and voltage values.

22 Claims, 3 Drawing Sheets

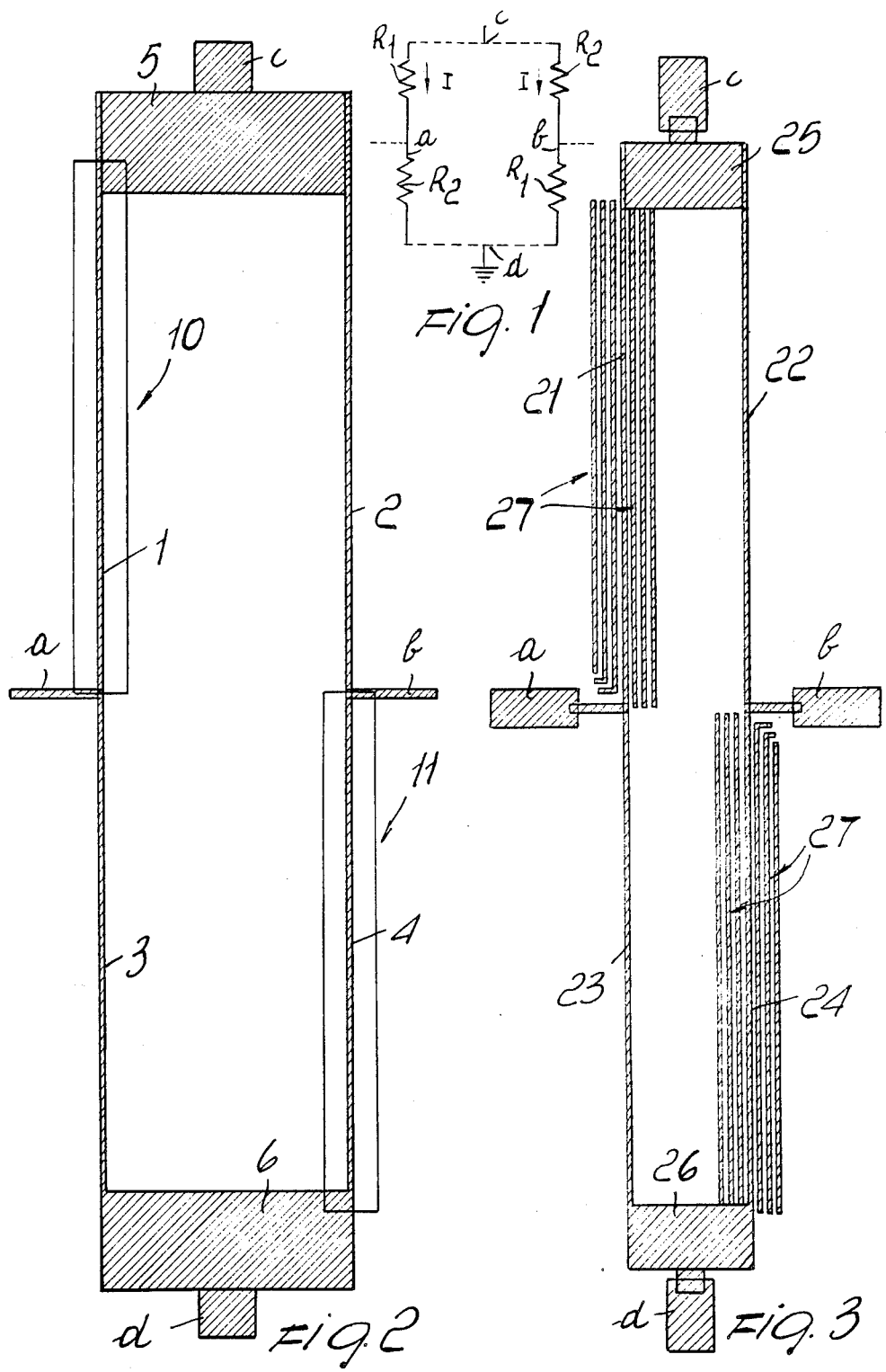

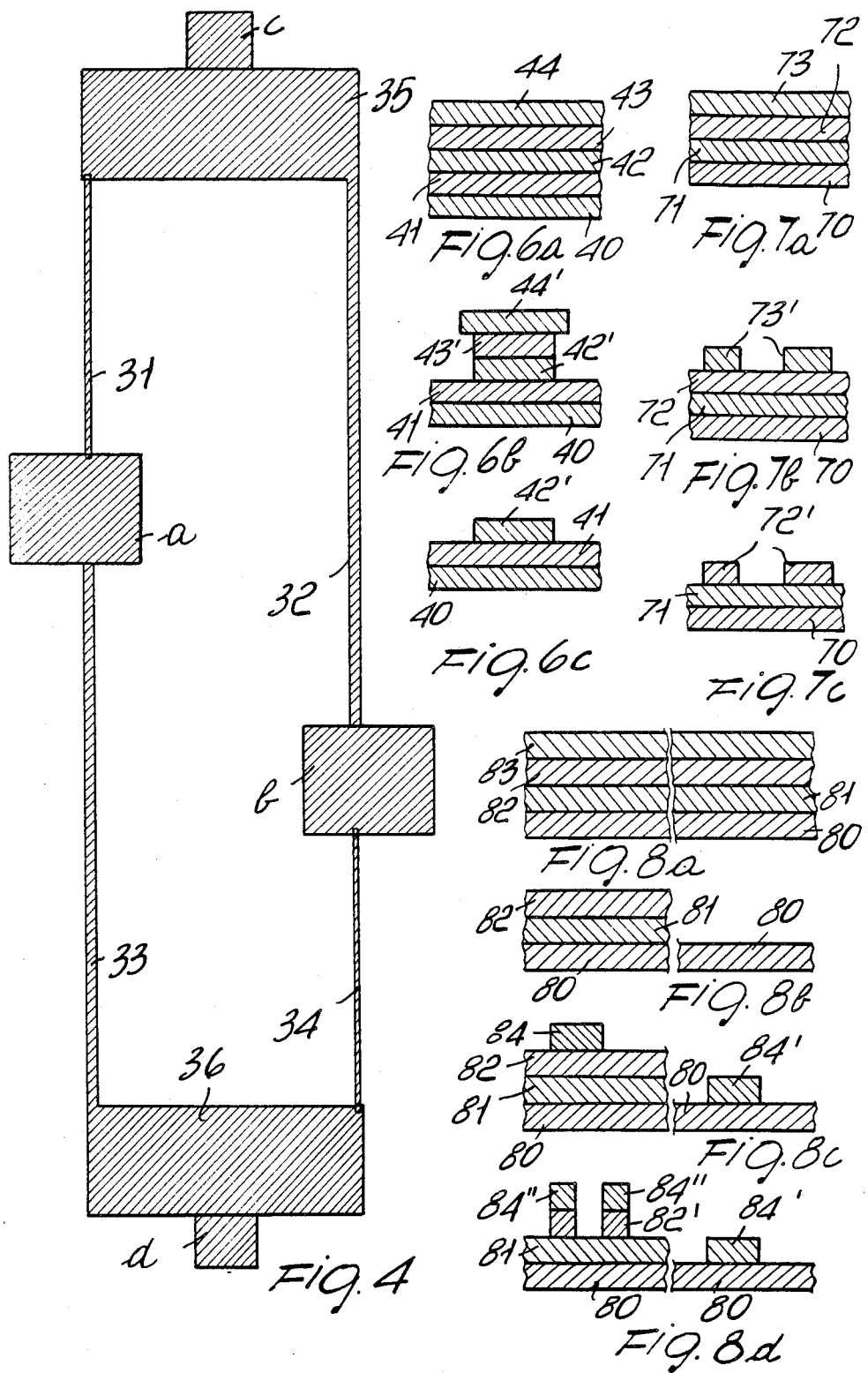

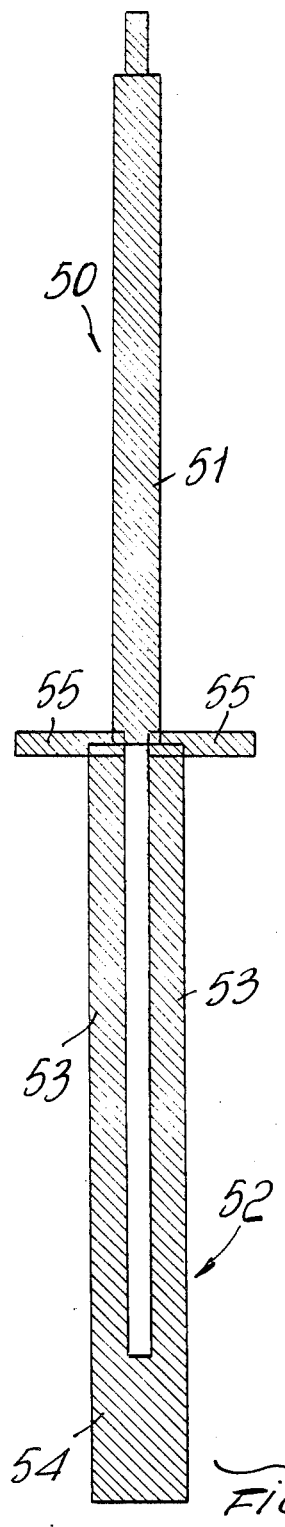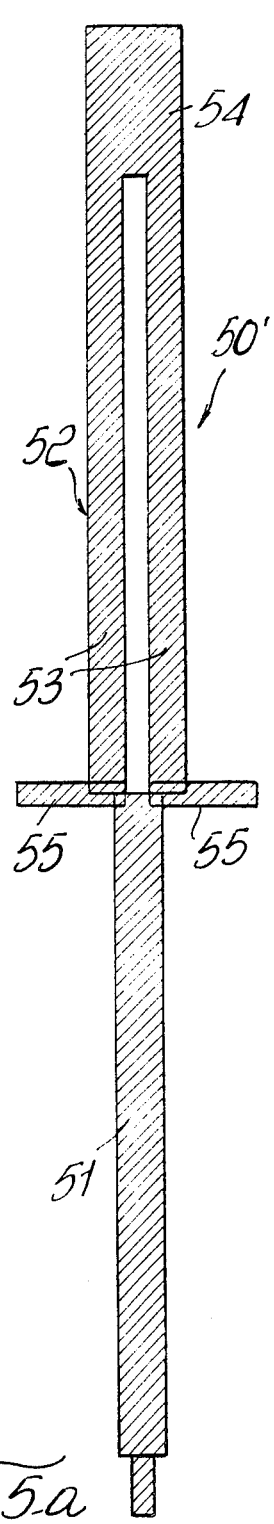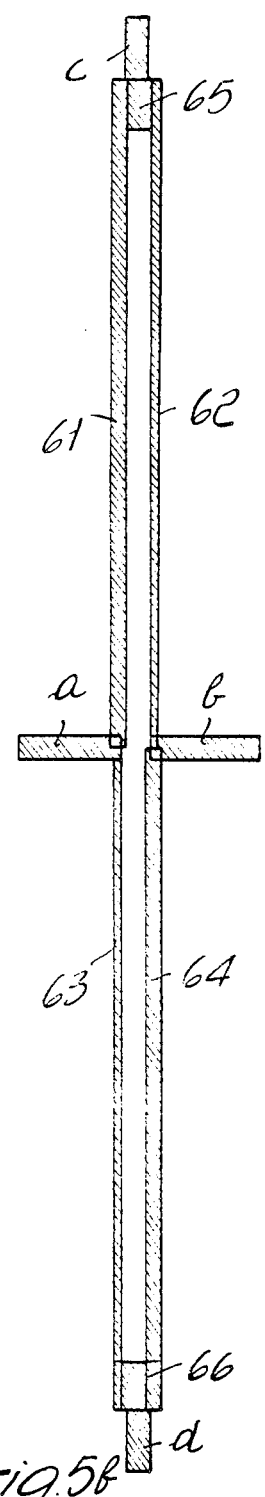
Fig. 5.a   Fig. 5.b

METHOD FOR EVALUATING PROCESSING PARAMETERS IN THE MANUFACTURE OF SEMICONDUCTOR DEVICES

BACKGROUND OF THE INVENTION

The present invention relates to a method for evaluating the processing parameters in the manufacture of semiconductor devices, particularly useful every time there are lithographic processes the characteristics of which are to be evaluated.

In order to maximize the performance of integrated circuits, it is necessary to control the processing parameters, and more specifically to point out those undesirable occurrences and phenomena which may affect the electrical characteristics of the finished product. Accordingly, it is more and more necessary to identify the sources of variability in the processing steps commonly used in the manufacture of integrated circuits, more specifically in the lithographic processes. This means that it is necessary to use measurement methods and test instruments which are capable of singling out the effects of the specific processing parameter from those related to different manufacture parameters. Generally, independently from the specific manufacturing method, there is the need to evaluate the characteristics of the machines used in the semiconductor device industry to point out the effects thereof on the product obtained therefrom.

More specifically, for this evaluation the following measurements are necessary: (a) measurement of the variation in width of the lines created with different lithographic processes (optical, electron-beam, X-ray, etc.) on plane surfaces or on surfaces with peculiar topographies; (b) measurement of the variation of the width of the lines created with lithographic techniques due to the effects of the neighborhood of other structures or to other occurrences (diffraction or proximity effects); (c) measurement of the linearity of the widths of lines replicated or drawn with lithographic methods in the range of values which is most suitable for the specific exposure machine or for the process under analysis; (d) measurement of the uniformity of layers etching used in the electronics industry, more specifically of the effects created by structures located close to the line to be measured (load effect) and of the sub-etching; (e) measurement of the uniformity of the thickness of the layers doped by ion implant and diffusion; and (f) measurement of the accuracy in registration between two levels, employing any registration system capable of replicating or drawing the specific structures used to evaluate the parameters.

In the prior art, processes are well-known which allow the measurement of the line width and of the accuracy in registration of a plurality of masks, by using the measurement of the resistance of the test resistive lines (see, e.g., the article by C. P. Auschnitt et al., "Application of wafer probe technique to the evaluation of projection printers", SPIE, Vol. 334, Optical Microlithography Technology for the Mid-1980s (1982), or the article by I. J. Stemp et al., "Automatic Testing and Analysis of Misregistrations Found in Semiconductor Processing", IEEE Transactions on Electron Devices, Vol. ED-26, No. 4, April 1979). Generally, the prior techniques consist of replicating or drawing figures on a conductive layer with uniform thickness and resistivity so as to create electrical resistors. Then the resistors thereof are calculated individually so as to obtain the required parameters. However, since the processing parameters (line width and misregistration value) are of the second order with respect to the values of the resistance involved, and more specifically depend on the difference of the individual resistance values found, the error committed in measurement can be even very significant.

In the article by K. H. Nicholas et al., "Measurement and Identification of Distortion, Alignment, and Mask Errors in IC Processing" (J. Electrochem. Soc. SOLID-STATE SCIENCE AND TECHNOLOGY, March 1981) a bridge is proposed for the direct measurement of the accuracy in registration of two configurations, which bridge has on two adjacent branches two resistors produced simultaneously by using two superimposed masks or by using a same mask shifted suitably during two exposure steps or appropriately protected, and two reference resistors having a reciprocally equal value but a much smaller resistance than the test resistors. By applying an appropriate voltage by means of a connected measurement device, it is possible to obtain directly the value of the misregistration being sought. This solution, though it allows to determine the misregistration value by directly measuring the difference in conductivity between the two test resistors, is however affected by some problems. In fact this circuit requires the measurement of the current flowing through an appropriately connected amperometer. However, this instrument adds a resistance, due, e.g., to the points of the instrument, to the connecting wires or to the amperometer itself. This additional contact resistance has an adverse effect on the measurement, reducing its precision. Furthermore, this known bridge, the two test arms of which are obtained by using the abovesaid two masks appropriately aligned with one another, so as to detect registration errors, does not allow the direct evaluation of the other processing parameters, as above indicated.

SUMMARY OF THE INVENTION

Therefore, the aim of the present invention is to provide a method for evaluating processing parameters in the manufacture of semiconductor devices, both integrated circuits, and circuits composed of discrete components, so as to allow the evaluation of the uniformity of some processing parameters and hence of the machines used in the manufacture of semiconductor devices.

More specifically, an object of the present invention is to provide a method for carrying out of all the measurements listed above in a reliable manner.

A further object of the present invention is to provide a method for evaluating processing parameters, which allows to obtain a higher precision than the prior art in the evaluation of the line width and in the accuracy of the registration, and which is in practice independent of the contact resistance due to the measure instruments, so as to yield more reliable results.

Not the least object of the present invention is to provide a method which can be performed simply, comprises steps which can be obtained by means of machines commonly used in the electronics industry, and yielding completely reliable results.

The aim described, the objects mentioned and others which will become apparent hereinafter are achieved by a method for evaluating the processing parameters in the manufacture of semiconductor devices, comprising a first step in which a resistive bridge is formed and a second step in which electrical characteristics of said bridge are measured, characterized in that said first step comprises fabricating an integrated symmetrical resistive bridge including first and second resistive parallel branches, each resistive branch having a reference resistive arm, a test resistive arm and an intermediate tap, said reference resistive arms of said first and second resistive branches being mutually equal and diagonally opposed and said test resistive arms of said first and second resistive branches being mutually equal and diagonally opposed, said test resistive arms having a topography according to the processing parameter to be evaluated, and said second step comprises applying to said bridge a known value current, measuring voltages present at said bridge and obtaining the conductance difference between said test and said reference resistive arms according to said known value current and said measured voltage values.

BRIEF DESCRIPTION OF THE DRAWINGS

Further characteristics and advantages will become apparent from the description of some preferred, but not exclusive, embodiments, illustrated in detail in the following description with reference to the accompanying drawings, where:

FIG. 1 is an equivalent electrical diagram of the bridge used according to the present invention;

FIG. 2 is the actual structure of the bridge as used for some kinds of measurement;

FIG. 3 is another embodiment of the bridge for other kinds of measurement;

FIG. 4 is a further modified bridge according to the present invention;

FIGS. 5a and 5b are respectively two partial masks and the mask obtainable by superimposing the two partial masks to perform measurement of the registration accuracy; and FIGS. 6a-8d each show a plurality of schematic cross sections through a silicon wafer, showing different steps of the manufacture of the bridge according to the invention, to perform three different measurements.

DESCRIPTION OF THE PREFERRED EMBODIMENTS

In order to carry out the abovementioned measurements, a bridge is replicated or drawn on a conductive layer having uniform thickness, which bridge has resistive arms implementing different topographies according to the type of measurements required. By measuring the values of the resistances of these arms it is thus possible to obtain the required measurements. In fact, with a conductive layer having a width w, a thickness d, a length L and a resistivity r, the electrical resistance R of the layer is given by the formula:

$$R = \frac{rL}{wd} = r_o \frac{L}{w}$$

where $r_o = r/d$ is the sheet resistance.

The required line width is thus given by $$w = \frac{r_o L}{R}$$

so that by knowing L and measuring R and $r_o$ it is possible to obtain the line width. More specifically, with two lines having widths $w_1$ and $w_2$, the difference in width of the two lines is given by the formula:

$$Dw = w_1 - w_2 = r_o L \left( \frac{1}{R_1} - \frac{1}{R_2} \right) \quad \text{(I)}$$

This relation between the difference in width of two lines and the difference of the inverses of the resistances was already well-known and employed according to the prior art to obtain the difference in line width. Generally, two independent measurements of $R_1$ and $R_2$ were made, which, after measuring $r_o$, allowed to obtain the difference in width according to the preceding formula (I). However, if the two resistors had very similar resistances, rather high errors could result.

According to the present invention, the bridge shown in FIG. 1 is used instead. As can be seen, the structure employed is composed of a symmetrical Wheatstone bridge with two branches of equal resistance, whereas the two arms diagonally opposite in the two branches have the same resistance value ($R_1$ or $R_2$). To this bridge, at the taps c and d intermediate of the resistive branches, a current 2I is fed, and the voltages with respect to the ground of the points a and b and the voltage present between a and b are measured. In practice, with this kind of bridge it occurs that $$\left( \frac{1}{R_1} - \frac{1}{R_2} \right) = I \left( \frac{1}{V_a} - \frac{1}{V_b} \right) = I \frac{V_{ab}}{V_a V_b} \quad \text{(II)}$$

Therefore, by knowing I and by measuring the other three voltages, the value of the first term of the equation (II) is found which then, once input into equation (I), gives the difference in width required and all the other values for the measurement and the evaluation of the processing parameters. In particular, if the resistances (and thus the conductivities) of all resistive arms are selected nominally equal, and one processing parameter to be evaluated is varied during manifacture of two opposed resistors (for example $R_1$, which thus represent test resistors) with respect to the manifacture of the other two opposite resistors ($R_2$, thus representing the reference resistors), the test resistors will show a conductance which is different from the the reference (nominal) conductance about an error value which may be detected and evaluated exploiting formula (II). In fact, as known, variation of the processing parameter causes a correspondent variation in the width of the test resistors and thus in their conductivities. Thus the conductivities (and the resistances) of the test resistors is no more equal to the preset nominal value, but will be equal to the nomianl conductance (or resistance) plus an error conductance (resistance). This error conductance is correlated to the processing parameter to be evaluated, which thus may be individually considered, pointing out its effects on the semiconductor structures.

In practice, according to the parameter to be evaluated, the topography (shape) of the resistive arms will be chosen appropriately, as exemplified and explained hereinafter.

More specifically, to perform the measurement of the variation in width of the lines created with lithographic techniques, the bridge illustrated in FIG. 2 is used. As can be seen, this bridge comprises four resistive arms 1-4 upwardly and downwardly connected at 5 and 6.

The resistive arms 1 and 4 are equal to each other and represent the test resistors $R_1$, while the resistive arms 2 and 3, also equal to each other, are the reference or comparison resistive arms and constitute the resitors $R_2$. When it is desired to measure the variation in width of the lines on plane surfaces, the resistive arms, having equal width, are provided above a plane structure, while for the evaluation of the effect of topography on the line width, by means of separate masks (schematically indicated with the reference numerals 10 and 11), below the arms 1 and 4, before manufacture thereof, topographies (recesses or relieves) are created so that on the layer forming the resistors or resistive arms 1 and 4, due to the physics of image replication processes, differences in line width may occur, which can be studied. By varying both the width of the arms and the topography of the structures created below the test arms, it is possible to evaluate the effects thereof.

To evaluate the variation in width of the lines created with lithographic techniques due to the effects of the proximity of other structures or other phenomena, the bridge shown in FIG. 3 may be used instead. This bridge, too, is composed of four resistive arms, in identical pairs, and precisely of two test resistive arms 21 and 24 and two reference resistive arms 22 and 23, opposite to each other and connected by means of the regions 25 and 26. In this case, the test resistive arms are surrounded by other structures, composed, e.g., of adjacent lines 27 not connected electrically to the test arms or connected only to the regions 25 and 26. In this case, it is possible to evaluate the difference between the width of isolated lines 22, 23 and that of lines 21, 24 surrounded by other structures. In this case, too, it is possible to use bridges with different line widths to evaluate the linearity, or lack thereof, of the effect.

An example of a bridge which can be used to evaluate the linearity of the width of lines replicated or drawn with lithographic methods for the evaluation of the specific exposure machine or of the process in use is shown in FIG. 4. This bridge comprises a pair of test arms 31 and 34 and a pair of reference arms 32 and 33, connected by the regions 35 and 36. In this case the length and the width of the arms 31–34 are selected so that the w/l ratio is constant for all the arms. If the processing is linear, then $V_{ab}=0$, otherwise the value of the voltage between the terminal a and the terminal b is different from zero. In this case according to the measured voltage values it is possible to evaluate the difference of the length to width ratio between the test and the reference arms according to the formula:

$$\frac{w_1}{L_1} - \frac{w_2}{L_2} = r_o\left(\frac{1}{R_1} - \frac{1}{R_2}\right) = r_o I \frac{V_{ab}}{V_a V_b}$$

The effects created by structures proximate to the line to be measured (load effect) and by the sub-etching on the uniformity of etching of layers used in the electronics can be evaluated once the effects of image replication by lithographic processes have been evaluated. The discrimination of the effects of the process used to create the resistor with respect to the process under evaluation can be performed with statistical and interpolation methods. To evaluate the line width variation due to the manufacture process of the resistors, it is possible to use the bridge shown in FIG. 4 and already described. This bridge is used on plane surfaces, in regions where the lithographic processing is linear. An interpretation of the data allows to obtain the sub-etching. Specifically, to evaluate the etching process of layers different from the one used to create the resistors, it is possible to use a specific process, schematically illustrated in its procedural steps in FIG. 6. A starting substrate 40 is oxidized so as to obtain an insulating oxide layer 41. Subsequently, deposition of the layer 42 is performed, in which the resistors composing the arms of the bridge according to the invention are to be formed, then deposition of the layer 43, of which it is desired to evaluate the characteristics, is performed. Then the resist layer 44 is applied (thus obtaining the structure schematically illustrated in FIG. 6a) and then the image is formed of the bridge arms to be produced (e.g. the arms of bridge shown in FIG. 4 or the test arms of other bridges). This image is generated according to a usual lithographic method which it is desired to evaluate. Subsequently, the etching of the layer 43, on which it is desired to evaluate the effects of the lithographic process being used, is performed, and then etching of the layer forming the test resistive arms is carried out. Thus, a structure as illustrated schematically in cross-section in FIG. 6b is obtained. Then the resist layer is removed, followed by the removal of the layer to be evaluated, thus obtaining the structure illustrated in FIG. 6c. Then an optional contact-creation step follows, and then the voltage measurements are carried out to evaluate the difference in width between the test resistive arms, obtained according to this method, and the reference resistive arms, produced in a conventional manner, so as to point out the desired effects. By using the method indicated, it is possible to evaluate effects due to the underlying topography (recesses and relieves) and load effects due to nearby geometries, sub-etching, etching uniformity, etc., using the bridge shown in FIG. 2.

To evaluate the uniformity of the layer thickness depending on the doping technique being used, it is possible to use a series of bridges with variable dimensions, e.g. that of FIG. 2, making subsequent use of interpolation methods. By creating the resistances by implant or by diffusion, it is possible to evaluate the uniformity of these processes.

Finally, to measure the registration accuracy between two levels of a registration system, the two masks shown in FIG. 5a are used. The two partial masks, indicated respectively with the reference numerals 50 and 51', are completely identical but rotated with respect to each other around a middle cross axis, here approximately defined by the regions 55 which can also be used as references for the registration. In detail, each of the masks 50 and 50' is provided with a first portion 51 having an elongated shape and uniform width and with a second portion 52 arranged as an extension of the first and composed of two arms 53, also elongated, which extend parallel to one another and are symmetrically spaced from the longitudinal axis of the first portion 51. These arms are connected at the region 54. By superimposing on each other the two masks and aligning them appropriately, and employing any lithographic processing, a bridge structure forms, similar to the one illustrated in FIG. 5b, which shows a pair of test arms 61 and 64 and a pair of reference arms 62 and 63 connected by the regions 65 and 66. In the case shown in FIG. 5d, a misregistration has been simulated, so that the width of the test arms 61 and 64 is greater than that of the reference arms 62 and 63, so that $R_1 \neq R_2$. More specifically, by evaluating the difference in line width between the test and the reference arms the misregistration of the two partial masks shown in FIG. 5a is obtained.

In order to evaluate the registration accuracy on the resist layer, the following method is carried out, illustrated schematically in some steps thereof in FIG. 7. First the structure composed of the substrate 70, the insulating layer 71, the resistive layer 72 and the resist layer 73, is generated (FIG. 7a). Then alignment crosses are created, to allow the registration of different levels. Then by making use of the negative of one of the two partial masks of FIG. 5a, followed by the alignment of the negative of the second partial mask and by following the usual lithographic methods, the pattern as illustrated in FIG. 5b and shown in cross section in FIG. 7b is obtained, where 73' represents two resistive portions corresponding to the arms 63 and 64 of the pattern of FIG. 5b. Then, after etching of the layer 72 and removal of the resist, the structure shown in FIG. 7c is obtained, which has portions 72' defining the resistors $R_1$ and $R_2$ having width $w_1$ and $w_2$. Then the operations for measuring the voltages present on the bridge follow, together with the evaluation of the errors in registration, as above explained.

For the measurement of the accuracy in registration on alignment crosses created with layers different from the resist and the resistor ones, the following method is followed instead. First (FIG. 8a) the structure composed of the substrate 80, an insulating layer 81, a resistor layer 82 and the resist layer 83 is created. Then (FIG. 8b) the resistor layer is removed from the regions where the alignment marks will be formed (to the right in the drawing) and thereafter deposition of the layer to be evaluated is performed. Then (FIG. 8c) alignment crosses are created (layer 84') together with the structure matching one of the partial masks of FIG. 5a (layer 84 corresponding to portion 51). Subsequently, the other partial mask is aligned to obtain the measurement bridge, of which FIG. 8d illustrates the cross sections through the two arms 63, 64 formed by the layers 82' and 84". After the removal (if desired) of the portions 84", the measurement to obtain the accuracy in registration are performed on the structure thus obtained.

As can be seen from the previous description, the invention fully achieves the intended aims. Indeed, a method has been provided which allows evaluation of different processing parameters in the manufacture of semiconductor devices, to reliably evaluate the characteristics of the processes used and of the machines employed in the electronics industry. This method, since it allows to obtain directly values which are proportional to the difference in conductance of two structures (test arms and reference arms) allows to achieve much greater precision with respect to the known processes, especially when the test resistors and the reference resistors have very small differences.

It should be noted that the method proposed is in practice insensitive to contact resistance, since by performing voltage measurements voltmeters are used, which have an extremely high internal resistance, which does not affect the accuracy of the results.

Furthermore, the method and the structures illustrated allow the evaluation and the singling out of the effects of the parameter whichit is desired to measure to allow the examination of the manufacturing methods and of the machines employed, so as to be able to optimize the use thereof according to the results required.

The invention thus conceived is susceptible to a number of modifications and variations, all of which are within the scope of the inventive concept. More specifically, instead of two partial masks to be superimposed, as illustrated in FIG. 5a, it is possible to employ a single mask having the two FIGS. 50 and 50' arranged side by side, and which are exposed, after alignment, in two subsequent steps to obtain the structure of FIG. 5b or a single mask with a single FIG. 50 may be employed, and this mask is subsequently exposed in two positions wherein the mask is rotated around the cross axis defined by the zones 55. Furthermore, the resistors may also be produced in other manners, e.g. by implanting them or diffusing them in the silicon, by employing a layer of oxide or resist to protect the region laterally outside the resistors, as a mask. Moreover, the masks may be used in the positive as shown or in the negative, with the hatched portions being transparent.

Furthermore, all the details may be replaced by other technically equivalent ones.

I claim:

1. A method for evaluating processing parameters in the manufacture of semiconductor devices, comprising a first step including fabricating an integrated symmetrical resistive bridge having first and second resistive parallel branches, each resistive branch having a reference resistive arm, a test resistive arm and an intermediate tap, said reference resistive arms of said first and second resistive branches being mutually equal and diagonally opposed said test resistive arms having a conductance comprising a nominal conductance and an error conductance due to a processing parameter to be evaluated, and said reference resistive arms having a reference conductance equal to said nominal conductance, and said test resistive arms of said first and second resistive branches being mutually equal and diagonally opposed, and a second step including applying to said bridge a known value current, measuring voltages present at said bridge and obtaining the conductance difference between said test and said reference resistive arms according to said known value current and said measured voltage values.

2. A method for evaluating processing parameters in the manufacture of semiconductor devices, comprising a first step including fabricating an integrated symmetrical resistive bridge having first and second resistive parallel branches, each resistive branch having a reference resistive arm, a test resistive arm and an intermediate tap, said reference resistive arms of said first and second resistive branches being mutually equal and diagonally opposed and said test resistive arms of said first and second resistive branches being mutually equal and diagonally opposed, and a second step including applying to said bridge a known value current, measuring voltages present at said bridge and obtaining the conductance difference between said test and said reference resistive arms according to the equation $$\frac{1}{R_1} - \frac{1}{R_2} = I \frac{V_{ab}}{V_a V_b}$$

in which I is said known value current, $R_1$ is the resistance of each test resistive arm, $R_2$ is the resistance of each reference resistive arm, $V_a$ is the voltage drop on each reference resistive arm, $V_b$ is the voltage drop on each test resistive arm, and $V_{ab}$ is the voltage drop between said intermediate taps.

3. A method according to claim 2, wherein all said resistive arms of said bridge have equal width.

4. A method according to claim 2, wherein, for measuring the width of lines creates with lithographic techniques on surfaces having peculiar topographies, said first step comprises fabricating topographies including recesses and relieves on portions of a substrate by means of first masking means and thereafter fabricating said integrated symmetrical resistive bridge by means of second masking means, with said test resistive arms extending on said substrate portions.

5. A method according to claim 2, wherein, for measuring variations in width of lines created with lithographic techniques due to neighborhood, diffraction and proximity effects, said first step comprises fabricating a plurality of lines and resistive patterns adjacent to and simultaneously with said test resistive arms.

6. A method according to claim 2, wherein, for measuring linearity of the width of lines created with lithographic methods, said first step comprises fabricating line-shaped resistive arms having a length and a width, with said length and width of said test resistive arms being different from said length and width of said reference resistive arms, said test resistive arms having a width/length ratio equal to said reference resistive arms.

7. A method according to claim 2, for measuring layer etching uniformity of semiconductor devices.

8. A method according to claim 2, wherein, for evaluating variations in line width due to resistor forming processes, said first step comprises fabricating line-shaped resistive arms having a length and a width, with said length and width of said test resistive arms being different from said length and width of said reference resistive arms, said test resistive arms having a width/length ratio equal to said reference resistive arms.

9. A method according to claim 2, wherein, for evaluating etching uniformity of a semiconductor layer different from a resistive bridge layer, on a semiconductor substrate an insulating layer is first grown by oxidation or deposition, then a semiconductor resistive layer is deposited, a layer to be evaluated and a resist layer are grown, a mask with a desired topography is lithographically created, a first etching to said layer to be evaluated and a second etching to said resistive layer are performed, said resist layer is removed, and then said second step is performed.

10. A method according to claim 2, for measuring thickness uniformity of a doped semiconductor layer depending on the doping process, including fabrication of a plurality of resistive bridges with test resistive arms having different dimensions and interpolation methods.

11. A method according to claim 2, wherein, for measuring registration accuracy of an alignment process, two, identical masks are exposed on a semiconductor layer, each mask comprising a figure including a first elongated portion having a width and a longitudinal symmetry axis and a second portion extending from said first portion and comprising two parallel sections arranged at a mutual distance which is smaller than said width and symmetrically to said longitudinal symmetry axis of said first portion, said masks being superimposed and aligned so as to superimpose said first portion of said first mask on said second portion of said second mask and are exposed for fabricating said resistive bridge and said second step is performed.

12. A method according to claim 2, wherein, for measuring registration accuracy of an alignment process, a mask is exposed on a semiconductor layer, said mask comprising alignment references and two equal figures, each said figure having a first elongated portion with a width and a longitudinal symmetry axis and a second portion extending from said first portion and comprising two parallel sections arranged at a mutual distance which is smaller than said width and symmetrically to said longitudinal symmetry axis of said first portion, said two figures being rotated around a middle cross axis extending between said first and second portions, said mask being exposed in sequence in a first position and in a second shifted position to obtain subsequent alignment of said alignment references of said figures of a same portion of said semiconductor layer, then said resistive bridge is formed and said second step is performed.

13. A method according to claim 11, wherein, for evaluating registration accuracy of a resist layer on a substrate, an insulating layer is formed, a resistive layer and subsequently a resist layer are grown on said insulating layer, alignment crosses are formed in said resist layer, said resist layer is masked by means of said mask figures, said resistive layer is etched, said resist layer is removed and said second step is carried out.

14. A method according to claim 12, wherein, for evaluating registration accuracy of a resist layer on a substrate, an insulating layer is formed, a resistive layer and subsequently a resist layer are grown on said insulating layer, alignment crosses are formed in said resist layer, said resist layer is masked by means of said mask figures, said resistive layer is etched, said resist layer is removed and said second step is carried out.

15. A method according to claim 11, wherein, for evaluating the registration accuracy on a semiconductor layer on a substrate an insulating layer, a resistive layer and a resist layer are grown, said resistor layer is removed in regions where alignment references are to be created, a test semiconductor layer to be evaluated is deposited, said test semiconductor layer is masked by means of said mask figures and said second step is carried out.

16. A method according to claim 12, wherein, for evaluating the registration accuracy on a semiconductor layer on a substrate an insulating layer, a resistive layer and a resist layer are grown, said resistor layer is removed in regions where alignment references are to be created, a test semiconductor layer to be evaluated is deposited, said test semiconductor layer is masked by means of said mask figures and said second step is carried out.

17. A resistive bridge for evaluating processing parameters in the manufacture of semiconductor devices, having a pair of test resistive arms and a pair of reference resistive arms formed in a single semiconductor layer, wherein said bridge is symmetrical, each pair of resistive arms being formed by two equal and diagonally opposite line-shaped resistors, said test resistive arms having a test conductance comprising a nominal conductance and an error conductance due to a processing parameter to be evaluated and said reference resistive arms having a reference conductance equal to said nominal conductance and said test resistive arms comprise resistors having a topography which is correlated to said processing parameter to be evaluated.

18. A resistive bridge for evaluating processing parameters in the manufacture of semiconductor devices, having a pair of test resistive arms and a pair of reference resistive arms formed in a single semiconductor layer, wherein said bridge is symmetrical, each pair of resistive arms being formed by two equal and diagonally opposite line-shaped resistors, and said test resistive arms comprise resistors having a topography which is correlated to a processing parameter to be evaluated, wherein said resistive arms have equal width, and said test resistive arms are formed on a substrate portion having topographies including recesses and relieves and said reference resistive arms are formed on a planar substrate portion.

19. A resistive bridge for evaluating processing parameters in the manufacture of semiconductor devices, having a pair of test resistive arms and a pair of reference resistive arms formed in a single semiconductor layer, wherein said bridge is symmetrical, each pair of resistive arms being formed by two equal and diagonally opposite line-shaped resistors, and said test resistive arms comprise resistors having a topography which is correlated to a processing parameter to be evaluated, wherein said test resistive arms comprise a plurality of adjacent lines.

20. A resistive bridge for evaluating processing parameters in the manufacture of semiconductor devices, having a pair of test resistive arms and a pair of reference resistive arms formed in a single semiconductor layer, wherein said bridge is symmetrical, each pair of resistive arms being formed by two equal and diagonally opposite line-shaped resistors, and said test resistive arms comprise resistors having a topography which is correlated to a processing parameter to be evaluated, wherein said test resistive arms have lengths and widths different from said reference resistive arms, said resistive arms having an equal width/length ratio.

21. A lithographic mask for forming a test bridge in a semiconductor layer, comprising at least one figure including alignment references and a first elongated portion having a width and a longitudinal symmetry axis and a second portion extending from said first portion and comprising two parallel sections arranged at a mutual distance which is smaller than said width and symmetrically to said longitudinal symmetry axis of said first portion.

22. A lithographic mask according to claim 21, comprising a further masking figure arranged adjacent to said at least one masking figure, said masking figures being identical and arranged rotated about a middle cross axis extending between said first and second portions.

* * * * *